United States Patent [19]

Shibib

[11] Patent Number: 5,773,338
[45] Date of Patent: Jun. 30, 1998

[54] BIPOLAR TRANSISTOR WITH MOS-CONTROLLED PROTECTION FOR REVERSE-BIASED EMITTER-BASED JUNCTION

[75] Inventor: Muhammed Ayman Shibib, Wyomissing, Pa.

[73] Assignee: Lucent Technologies Inc., Murray Hill, N.J.

[21] Appl. No.: 562,235

[22] Filed: Nov. 21, 1995

[51] Int. Cl.$^6$ ................................. H01L 29/72
[52] U.S. Cl. .................... 438/202; 438/197; 438/204; 438/234; 438/369; 438/372; 438/597; 257/378
[58] Field of Search .................... 257/378; 438/197, 438/202, 204, 234, 369, 372, 597

[56] References Cited

U.S. PATENT DOCUMENTS

| | | | |
|---|---|---|---|
| 4,804,634 | 2/1989 | Krishna et al. | 437/32 |
| 4,821,089 | 4/1989 | Strauss | 357/68 |
| 5,027,184 | 6/1991 | Soclof | 357/49 |
| 5,043,786 | 8/1991 | Desilets et al. | 357/35 |
| 5,043,787 | 8/1991 | Soclof | 357/35 |
| 5,070,381 | 12/1991 | Scott et al. | 357/35 |

OTHER PUBLICATIONS

S. Verdonckt–Vandebroek et al., "A Complementary High Current Gain Transistor for use in a CMOS Compatible Technology", *IEEE 1990 Bipolar Circuits and Technology Meeting* 4.2, 1990, pp. 82–85.

S. Verdonckt–Vandebroek et al., "High–Gain Lateral Bipolar Action in a MOSFET Structure", *IEEE Transactions on Electron Devices*, vol. 38, No. 11, Nov. 1991, pp. 2487–2496.

S. Verdonckt–Vandebroek et al., "High–Gain Lateral p–n–p Bipolar Action in a p–MOSFET Structure", *IEEE Electron Device Letters*, vol. 13, No. 6, Jun. 1992, pp. 312–313.

S. Parke et al., "A High–Performance Lateral Bipolar Transistor Fabricated on SIMOX", *IEEE Electronics Device Letters*, vol. 14, No. 1, 1993, pp. 33–35.

R. Zambrano, "Improved Structures for Power MOSFETs With Full On–Chip Protection", *Fifth European Conference on Power Electronics and Applications on behalf of the European Power Electronics Association*, No. 377, vol. 2, Sep. 13–16, 1993, pp. 1–4.

M. Shibib et al., "A Cost–Effective Smart Power BiCMOS Technology", *Proceedings of The 7th International Symposium on Power Semiconductor Devices & ICs*, Yokohama, Japan, May 23–25, 1995, pp. 48–53.

J. Olsson et al., "High Current Gain Hybrid Lateral Bipolar Operation of DMOS Transistors", *IEEE Transactions on Electron Devices*, vol. 42, No. 9, Sep. 1995, pp. 1628–1634.

*Primary Examiner*—Edward Wojciechowicz

[57] ABSTRACT

A bipolar transistor with MOS-controlled protection for a reverse-biased emitter-base junction is disclosed. A bipolar transistor and a MOS transistor are configured with the drain and the gate electrically coupled to the emitter, and the source and body electrically coupled to the base. A reverse-bias at the emitter-base junction, which is less than a breakdown voltage for the emitter-base junction, activates the MOS transistor which substantially reduces the resistance between the emitter and the base. Preferably, a first semiconductor region provides both the drain and the emitter, and a second semiconductor region provides both the body and the base, for reduced surface area on an integrated circuit chip.

17 Claims, 7 Drawing Sheets

BIPOLAR TRANSISTOR WITH MOS-CONTROLLED PROTECTION FOR REVERSE-BIASED EMITTER-BASED JUNCTION

FIELD OF THE INVENTION

The invention relates generally to transistors, and more particularly to bipolar transistors with protection for reverse-biased emitter-base junctions.

DESCRIPTION OF RELATED ART

Bipolar transistors may receive a large reverse-bias at the emitter-base junction during normal operation or under fault conditions. For instance, a forward-biased emitter-base junction may be subsequently reverse-biased, instead of non-biased, to reduce turn-off time between the collector and the emitter. In this instance, a large reverse-bias may arise by design, or may arise from an undesired voltage spike leading an otherwise moderate reverse-bias. In addition, during non-operation, the emitter-base junction may receive a large reverse-bias due to electrostatic discharge, which can be a high-voltage, high-current event. For instance, electrostatic voltages may range above 1000 volts during the production or subsequent handling of an integrated circuit.

Bipolar transistors are susceptible to damage and degradation when the emitter-base junction receives a large reverse-bias. When a reverse-bias across the emitter-base junction approaches a breakdown voltage, a large leakage current occurs across the junction. When the reverse-bias reaches or exceeds the breakdown voltage, a strong electric field creates new carriers by removing valence electrons from their bonds, the new carriers produce additional carriers again through the process of disrupting bonds, and a large reverse current flows across the emitter-base junction. This phenomena is known as avalanche breakdown. Both avalanche breakdown and high leakage currents tend to inject hot carriers into an adjacent dielectric layer. A number of these injected carriers may become trapped ions in the adjacent dielectric layer which degrade the operating characteristics of the bipolar transistor.

Protective devices for reverse-biased emitter-base junctions are known in the art. For instance, a zener diode may be coupled in shunt across the emitter-base junction. The zener diode essentially provides a short-circuit across the emitter-base junction in response to a reverse-bias that is considerably less than the breakdown voltage for the emitter-base junction. As a result, the zener diode protects the emitter-base junction from avalanche breakdown and high leakage currents. The zener diode, however, is typically an independent and isolated device that requires additional surface area on an integrated circuit chip. Furthermore, the junction capacitance of a zener diode may decrease switching speeds of the bipolar transistor.

Therefore, a need exists for protecting a reverse-biased emitter-base junction from avalanche breakdown and high leakage currents in an efficient and cost-effective manner.

SUMMARY OF THE INVENTION

A primary aspect of the invention is a bipolar transistor with MOS-controlled protection for a reverse-biased emitter-base junction.

In one embodiment of the invention, a bipolar transistor and a MOS transistor are configured such that a reverse-bias at the emitter-base junction, which is less than a breakdown voltage for the emitter-base junction, activates the MOS transistor so as to reduce a resistance between the emitter and the base. For instance, the reverse-bias may turn on the MOS transistor, or the reverse-bias may cause punch-through in the MOS transistor. In either case, the drain and the source are electrically coupled to the emitter and the base. Therefore, the activated MOS transistor provides a low resistance path between the emitter and the base which makes it more difficult for the reverse-bias to reach the breakdown voltage, or high leakage voltage, at the emitter-base junction.

The bipolar transistor and the MOS transistor can be configured, for instance, with the drain and the gate electrically coupled to the emitter, and the source and the body electrically coupled to the base, where the threshold voltage of the MOS transistor is less than the breakdown voltage. When a reverse-bias across the emitter-base junction exceeds the threshold voltage, the MOS transistor turns on such that a conductive channel provides essentially a short circuit between the emitter and the base.

Alternatively, the bipolar transistor and the MOS transistor can be configured with the drain electrically coupled to the emitter, and the gate, source and body electrically coupled to the base, where the punch-through voltage of the MOS transistor is less than the breakdown voltage. When a reverse-bias across the emitter-base junction exceeds the punch-through voltage, the punch-through current in the MOS transistor provides essentially a short circuit between the emitter and the base.

The bipolar transistor and the MOS transistor are preferably configured for reduced surface area on an integrated circuit chip. For instance, a first semiconductor region may provide both the drain and the emitter, and a second semiconductor region may provide both the body and the base. In this manner, the conductive channel and/or punch through occurs in the base.

Another embodiment of the invention includes a first region of a first conductivity type for providing a collector, a second region of a second conductivity type opposite the first conductivity type for providing a base, a third region of the first conductivity type for providing an emitter, a fourth region of the first conductivity type electrically coupled to the second region, a dielectric layer in contact with the second region, and an electrode in contact with the dielectric layer and electrically coupled to the third region, wherein the electrode provides a gate for a MOS transistor, the second region provides a channel region for the MOS transistor, the third region provides a drain for the MOS transistor, the fourth region provides a source for the MOS transistor, and a threshold voltage for the MOS transistor is less than a breakdown voltage for an emitter-base junction between the second and third regions.

Preferably, the first, second, third and fourth regions extend to a lateral surface, the second region is a well in the first region, the third and fourth regions are spaced wells in the second region, the channel region is a portion of the second region between the third and fourth regions at the lateral surface, and the dielectric layer and the electrode are above the channel region. It is also preferred that the first region includes a first heavily doped region of the first conductivity type extending to the lateral surface for providing a collector contact, the second region includes a second heavily doped region of the second conductivity type extending to the lateral surface for providing a base contact, the third region is a third heavily doped region of the first conductivity type, and the fourth region is a fourth heavily doped region of the first conductivity type in contact with the second heavily doped region.

The second, third and fourth regions can also be configured to provide a parasitic bipolar transistor, in which the second region provides a parasitic base, the third region provides a parasitic collector, and the fourth region provides a parasitic emitter, such that the parasitic bipolar transistor turns on after the MOS transistor activates in response to a large reverse-bias with high reverse-current across the emitter-base junction. The parasitic bipolar transistor provides still further protection for the emitter-base junction.

Advantageously, the invention can be configured to provide relatively simple, compact, low capacitance, highly effective protection against electrostatic discharge, avalanche breakdown, and high leakage currents at the emitter-base junction of small bipolar transistors. In addition, various embodiments of the invention are easily fabricated using standard CMOS, BiCMOS, or bipolar processing technologies.

BRIEF DESCRIPTION OF THE DRAWING

The invention, together with its various features and advantages, can be readily understood from the following detailed description taken in conjunction with the accompanying drawing, in which.

DETAILED DESCRIPTION

Figure 1:
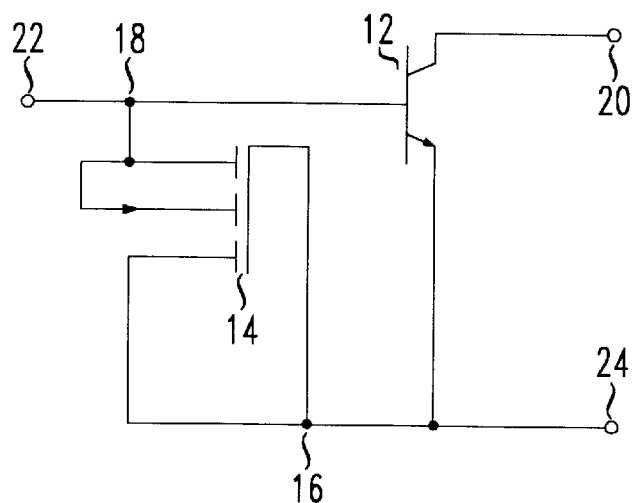
FIG. 1 is a circuit diagram of a device in accordance with an embodiment of the invention.

FIG. 1 is a circuit diagram of a device in accordance with an embodiment of the invention. Device 10 includes NPN bipolar transistor 12 and N-channel enhancement-mode MOS transistor 14. The drain and gate of MOS transistor 14 are electrically coupled to the emitter of bipolar transistor 12 at node 16. The source and body of MOS transistor 14 are electrically coupled to the base of transistor 12 at node 18. The collector, base and emitter are electrically coupled to terminals 20, 22 and 24, respectively. The threshold voltage of MOS transistor 14 is less than the breakdown voltage for the emitter-base junction of bipolar transistor 12. As a result, when a reverse-bias of at least the threshold voltage is applied to the emitter-base junction, then MOS transistor 14 turns on and substantially reduces the resistance between the emitter and the base. In this manner, MOS transistor 14 makes it more difficult for a reverse-bias at the emitter-base junction to reach the breakdown voltage of the emitter-base junction. In effect, MOS transistor 14 provides a reverse-bias voltage clamp at the emitter-base junction of bipolar transistor 12.

Figure 2:
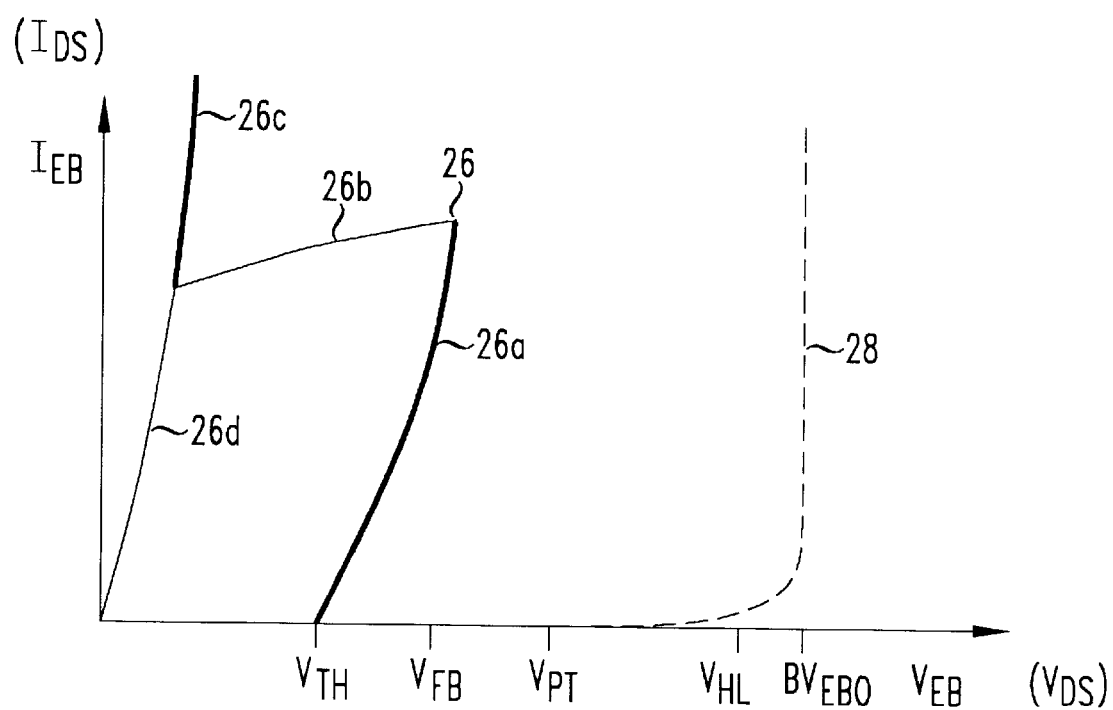
FIG. 2 is a current-voltage characteristic of the device of FIG. 1, FIGS. 3–11 are cross-sectional views illustrating consecutive processing steps used to fabricate the device of FIG. 1, FIGS. 12–14 are top plan views of FIGS. 6, 8 and 11, respectively.

FIG. 2 is a current-voltage characteristic of the device of FIG. 1. The horizontal axis depicts a voltage at terminal 24 with respect to terminal 22. Thus, the horizontal axis depicts the emitter-base voltage ($V_{EB}$) of bipolar transistor 12, as well as the drain-to-source voltage ($V_{DS}$) of MOS transistor 14. For convenience, the voltage along the horizontal axis to the right of the origin is referred to as reverse-bias. The horizontal axis also shows the locations of the threshold voltage ($V_{TH}$) for MOS transistor 14, the punch-through voltage ($V_{PT}$) for MOS transistor 14, and the breakdown voltage of the emitter-base junction ($BV_{EBO}$) for bipolar transistor 12. The vertical axis depicts the current flow between terminal 24 and terminal 22. Thus, the vertical axis depicts the emitter-base current ($I_{EB}$) of bipolar transistor 12, as well as the drain-to-source current ($I_{DS}$) of MOS transistor 14. For convenience, the current along the vertical axis above the origin is referred to as emitter-base current.

For a reverse-bias less than the threshold voltage, there is essentially no emitter-base current. When the reverse-bias reaches the threshold voltage, the gate-to-source voltage ($V_{GS}$) of MOS transistor 14 also reaches the threshold voltage, and MOS transistor 14 turns on. The emitter-base current, provided by a conductive channel (inversion layer) in MOS transistor 14, is shown as thick line segment 26a of solid line 26. Line segment 26a becomes essentially vertical well before the reverse-bias reaches the breakdown voltage. This shunting action makes it far more difficult for the reverse-bias to reach or approach the breakdown voltage.

It is noted that the punch-through voltage for transistor 10 is substantially larger than the threshold voltage. Therefore, transistor 10 activates by turning on before punch-through occurs.

For illustration purposes, the emitter-base current that would result in the absence of MOS transistor 14 is shown as broken line 28. When the reverse-bias reaches high leakage voltage ($V_{HL}$), which is near the breakdown voltage, a substantial amount of leakage current flows across the emitter-base junction.

Advantageously, the threshold voltage is substantially less than the high leakage voltage, as well as the breakdown voltage, to provide a safety margin. However, too small a threshold voltage may be disadvantageous, since it may be desirable to apply a moderate reverse-bias to the emitter-base junction to rapidly turn off bipolar transistor 12. Therefore, a standard CMOS threshold voltage in the range of approximately 0.6 to 0.8 volts is generally not preferred. Instead, a threshold voltage in the range of approximately 2 to 4 volts, and an emitter-base breakdown voltage in the range of approximately 5 to 7 volts, are preferred. MOS transistor 14 has a threshold voltage of 3 volts, and bipolar transistor 12 has an emitter-base breakdown voltage of 6 volts.

Referring still to FIG. 2, if the reverse-bias continues to increase after MOS 14 turns on, and supplies enough current to reach a forward breakover voltage ($V_{FB}$), then a parasitic bipolar transistor in device 10 turns on. The collector of the parasitic bipolar transistor is provided by the drain of MOS transistor 14, the base of the parasitic bipolar transistor is provided by the body of MOS transistor 14, and the emitter of the parasitic bipolar transistor is provided by the source of MOS transistor 14, as further described below. When the parasitic bipolar transistor turns on, the emitter-base current (of transistor 12) sweeps along thin line segment 26b to thick line segment 26c. That is, the reverse-bias drops to approximately the collector-emitter voltage of the parasitic bipolar transistor. Advantageously, a larger emitter-base current is required along line segment 26c than along line segment 26a before the reverse-bias reaches the breakdown voltage or the high leakage voltage. Therefore, the parasitic bipolar transistor provides still further protection for the emitter-base junction. When the reverse-bias decreases after the parasitic bipolar transistor turns on, the emitter-base current will depend on the emitter voltage. For instance, with a relatively large emitter voltage, the emitter-base current sweeps across line segment 26b back to line segment 26a, whereas if the emitter is grounded then the emitter-base current follows thin line segment 26d to the horizontal axis.

FIGS. 3–11 are cross-sectional views illustrating consecutive processing steps used to fabricate device 10. As used herein, the "structure" refers to the device as fabricated in the previous processing steps. It is understood that the drawing is not to scale for convenience of explanation.

Figure 3:
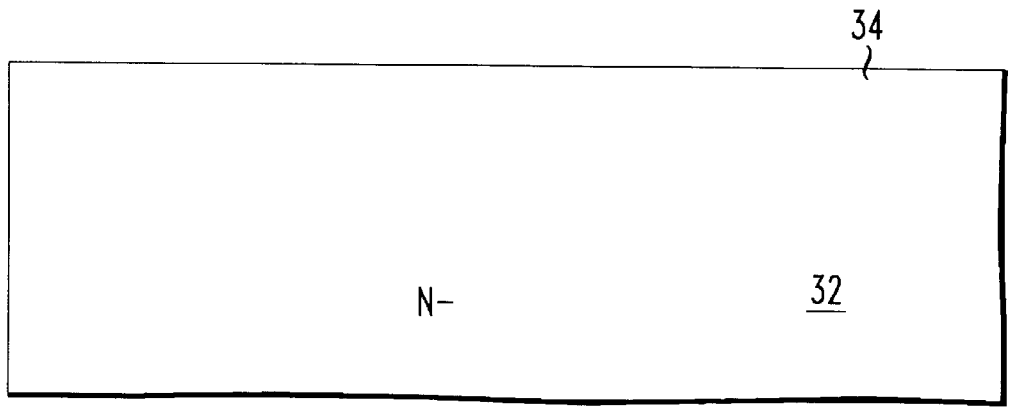

In FIG. 3, N-type substrate 32 provides the starting material for the fabrication process. N-type substrate 32 is composed of <100>oriented crystalline silicon lightly doped N-type to a conductivity of approximately 10 ohms-cm. N-type substrate 32 includes an upper lateral surface 34. N-type substrate 32 may be an N-type region deposited or diffused in a larger P type wafer (not shown). N-type substrate 32 is preferably a portion of an integrated circuit chip in which device 10 is contained. N-type substrate 32 provides the collector for bipolar transistor 12.

Figure 4:
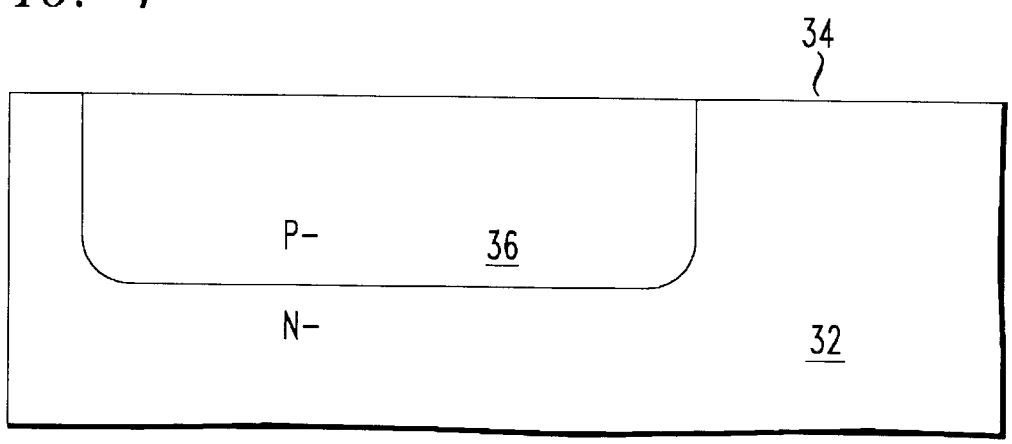

In FIG. 4, lightly doped P-type region 36 is formed in N-type substrate 32. A first mask (not shown) on surface 34 defines P-type region 36, and the structure is subjected to an ion implantation of P type ions such as boron having an energy of approximately 60 Kiloelectron-Volts at a density of approximately $6 \cdot 10^{13}$ ions/cm$^2$. After implantation, the first mask is removed, and the structure is annealed at 1200° C. for 20 minutes in an inert ambient so that P-type region 36 is driven into N-type substrate 32. Thus, P-type region 36 forms a well (or tub) in N-type substrate 32 that extends to surface 34. P-type region 36 has a boron concentration at surface 34 of approximately $10^{17}$ atoms/cm$^3$. P-type region 36 provides the base for bipolar transistor 12 and a body for MOS transistor 14.

Figure 5:
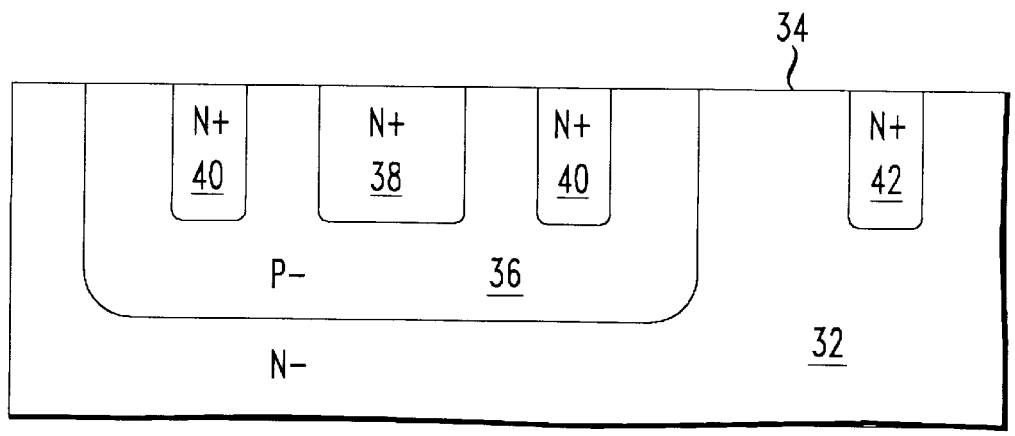

In FIG. 5, heavily doped N+type regions 38 and 40 are formed in P-type region 36, and heavily doped N+type region 42 is formed in N-type substrate 32. N+type region 38 is defined by a first opening in a second mask (not shown), N+type region 40 is defined by a second opening in the second mask, and N+type region 42 is defined by a third opening in the second mask. The structure is subjected to an ion implantation of N type ions such as phosphorus having an energy of approximately 60 Kiloelectron-Volts at a density of approximately $3 \cdot 10^{15}$ ions/cm$^2$. After implantation, the second mark is removed, and the structure is annealed at 1000° C. for 30 minutes in an oxidizing ambient so that N+type regions 38 and 40 are driven into P-type region 36, and N+type region 42 is driven into N-type substrate 32. Thus, N+type regions 38 and 40 each forms a well (or tub) in P-type region 36, and N+type region 42 forms a well (or tub) in N-type substrate 32. N+type regions 38, 40 and 42 each extend to surface 34. Furthermore, N+regions 38, 40 and 42 are formed simultaneously. N+type region 38 provides the emitter for bipolar transistor 12, as well as an emitter contact, and the drain for MOS transistor 14. N+type region 40 provides the source for MOS transistor 14. Therefore, P-type region 36 between regions 38 and 40 at surface 34 provides the channel region for MOS transistor 14. N+type region 42 provides a collector contact in ohmic contact with N-type substrate 32.

Figure 6:
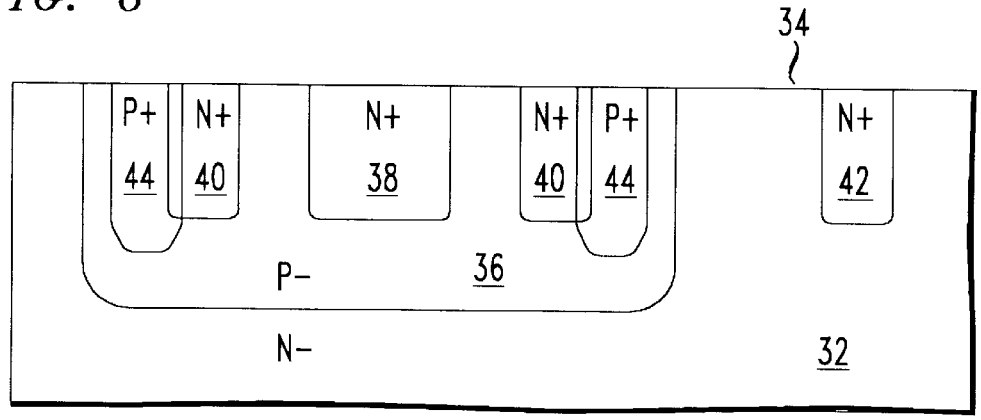
Figure 12:
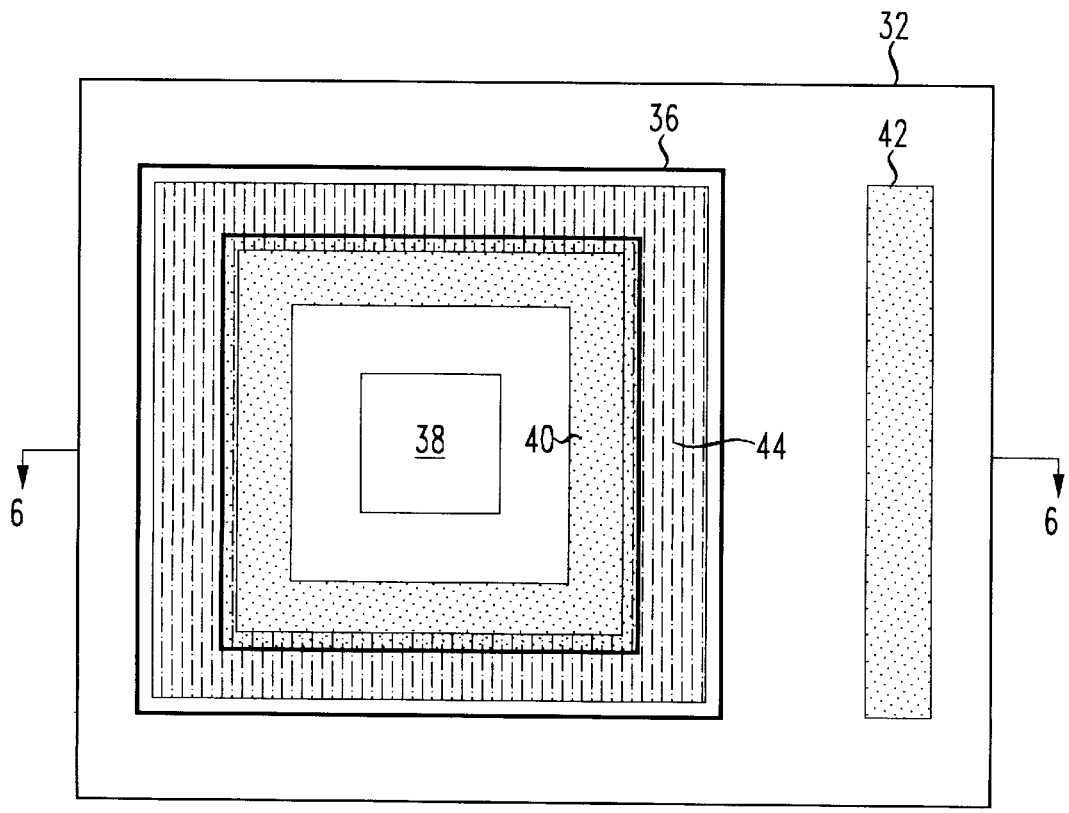

In FIG. 6, heavily doped P+type region 44 is formed in P-type region 36 and in contact with N+type region 40. The structure is subjected to an ion implantation of P type ions such as boron having an energy of approximately 60 Kiloelectron-Volts at a density of approximately $5 \cdot 10^{15}$ ions/cm$^2$ through a third mask (not shown). After implantation, the third mask is removed, and the structure is annealed at 1000° C. for 30 minutes in an oxidizing ambient so that P+type region 44 is driven into P-type region 36 and into N+type region 40. Thus, P+type region 44 forms a well (or tub) in P-type region 36 that extends to surface 34. N+type region 40 forms a single well which surrounds N+type region 38, and P+type region 44 forms a single well which surrounds N+type regions 38 and 40, as shown by top plan view in FIG. 12. Furthermore, P+type region 44 is outside the channel region between N+type regions 38 and 40. P+type region 44 provides a base contact in ohmic contact with P-type region 36.

The depth of P-type region 36 is approximately 1.5 micrometers, the depths of N+type region 38, 40 and 42 are approximately 0.5 micrometers, and the depth of P+type region 44 is approximately 1.0 micrometers. The length of P-type region 36 at surface 34 between N+type regions 38 and 40 (i.e., the channel region length) is approximately 1.0 micrometers.

Figure 7:
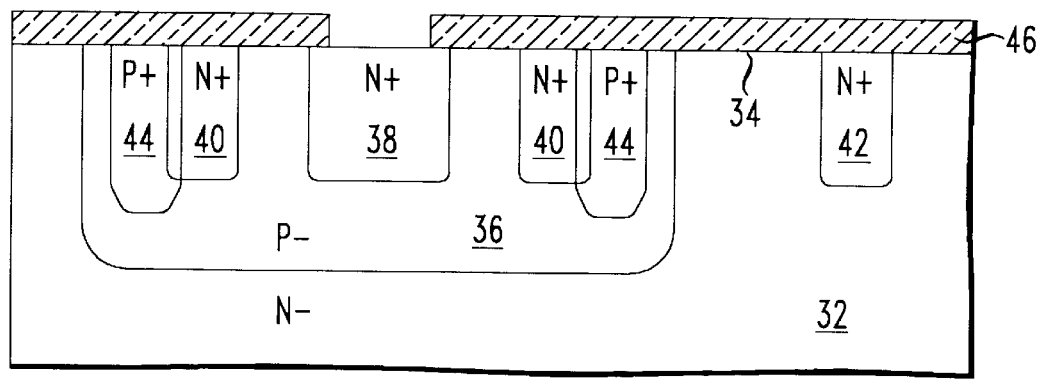

In FIG. 7, silicon dioxide 46 is selectively formed on portions of surface 34. Initially, a sacrificial layer of silicon dioxide (not shown) is formed by thermal oxidation on surface 34 by placing the structure in an oxidizing ambient at a temperature of approximately 1000° C. for approximately 80 minutes. The sacrificial layer is then removed using wet chemical etching in hydrofluoric acid. Removing the sacrificial layer provides surface preparation by removing surface defects. Next, a high quality layer of silicon dioxide 46 is formed by thermal oxidation on the exposed upper surfaces by placing the structure in an oxidizing ambient at a temperature of approximately 1000° C. for approximately 80 minutes. Silicon dioxide 46 is relatively thin, with a relatively uniform thickness of approximately 0.0850 micrometers. Silicon dioxide 46 is then patterned using wet chemical etching through a fourth photoresist mask (not shown) to form an opening that exposes N+type region 38. Silicon dioxide 46 provides the gate oxide for MOS transistor 14.

Figure 8:
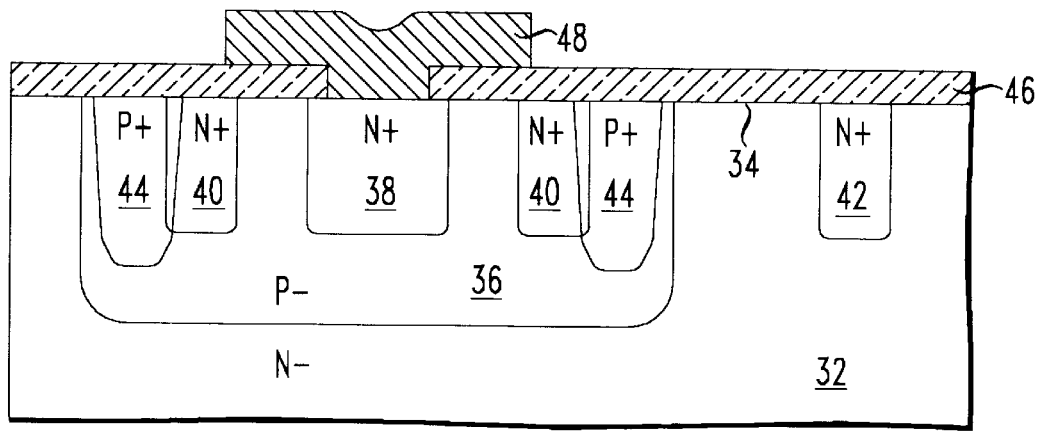
Figure 13:
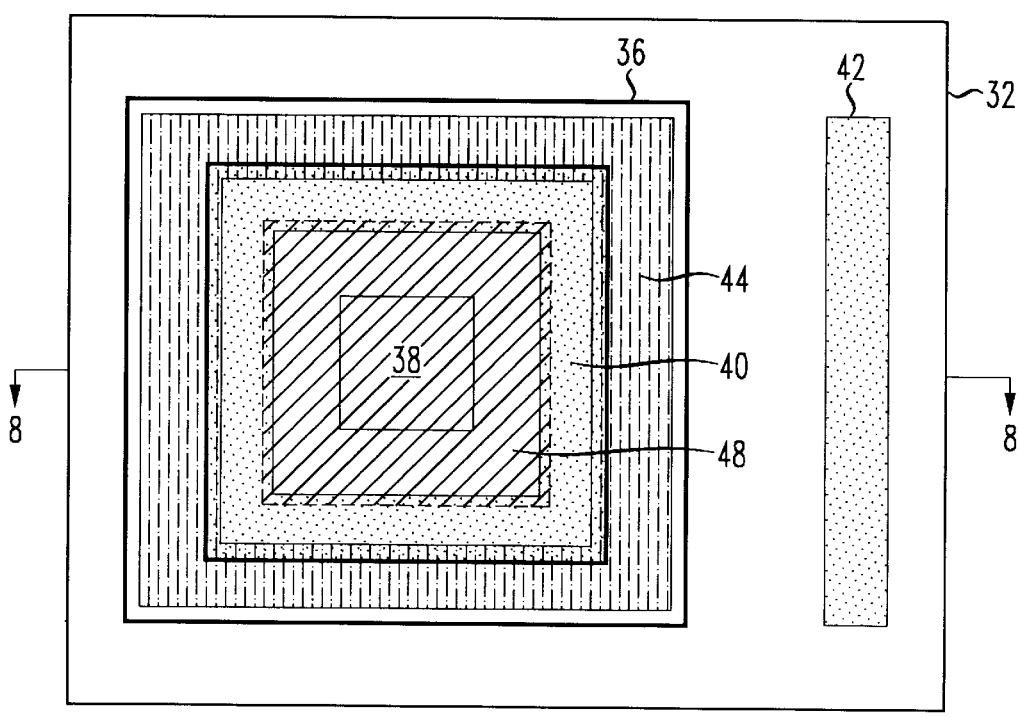

In FIG. 8, a layer of polycrystalline silicon or polysilicon 48 is formed on silicon dioxide 46, and on N+type region 40. The formation of polysilicon 48 includes low pressure chemical vapor deposition of a 0.5 micrometer thick layer of polysilicon on silicon dioxide 48, heavily doping the polysilicon to N+type using one of several techniques, such as ion implantation or in situ doping with phosphorus, and patterning the doped polysilicon by plasma etching through a fifth photoresist mask (not shown). As is seen, polysilicon 48 is in contact with and electrically coupled to N+type region 38. Furthermore, polysilicon 48 is isolated from the channel region (in region 36 at surface 34 between regions 38 and 40) by silicon dioxide 46. Polysilicon 48 covers N+type region 38, a portion of N+type region 40, and the channel region therebetween, as shown by top plan view in FIG. 13. Polysilicon 48 provides the gate for MOS transistor 14.

Figure 9:
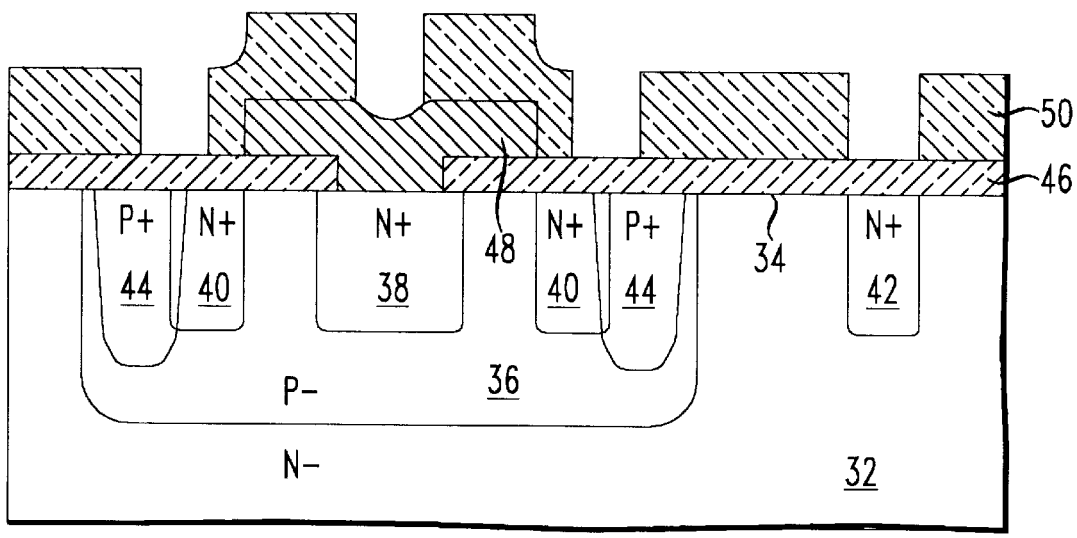

In FIG. 9, a protective glass layer is formed on the structure. A blanket layer of boron phosphor silicate glass (BPSG) 50 is deposited by low pressure chemical vapor deposition over the exposed upper surfaces, and densified in an oxidizing ambient at 900° C. for 30 minutes. Glass 50 has a thickness in the range of approximately 1.0 to 1.5 micrometers. Glass 50 is then anisotropically patterned by applying a plasma etch through openings in a sixth photoresist mask (not shown). The plasma etch also anisotropically etches the exposed portions of silicon dioxide 46 directly beneath the etched portions of glass 50. This forms contact windows which expose portions of regions 40, 42, and 44, and polysilicon 48. The contact windows have narrow line widths of approximately 1.0 micrometers.

Figure 10:
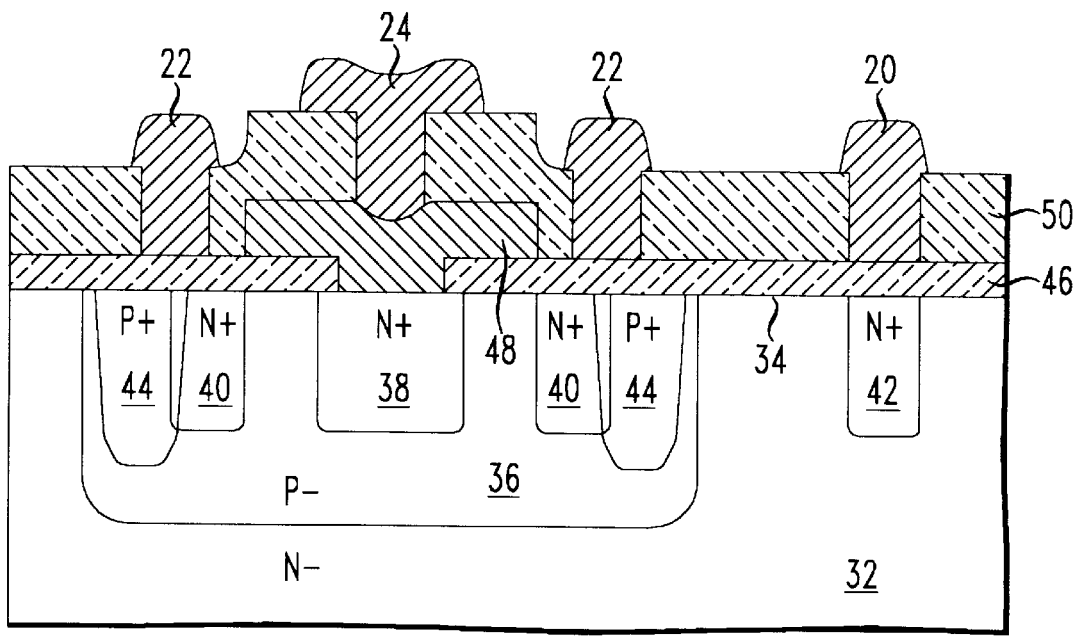

In FIG. 10, terminals 20, 22 and 24 are formed. Initially, a blanket layer of aluminum is sputter deposited onto the exposed upper surfaces. The aluminum fills the contact windows. Then, portions of the aluminum outside the contact windows are removed by plasma etching through a seventh photoresist mask (not shown). As a result, terminals 20, 22 and 24 are electrically coupled to region 42, regions 40 and 44, and polysilicon 48, respectively. Furthermore, since polysilicon 48 is electrically coupled to N+type region 38, terminal 24 is electrically coupled to N+type region 38. Thus, N+type region 42 provides a collector contact for collector terminal 20, P+type region 44 provides a base contact for base terminal 22, and N+type region 38 provides an emitter contact for emitter terminal 24. Of course, terminals 20, 22 and 24 may be interconnected by additional metallization (not shown) to other circuits in an integrated circuit chip embodying device 10.

Figure 11:
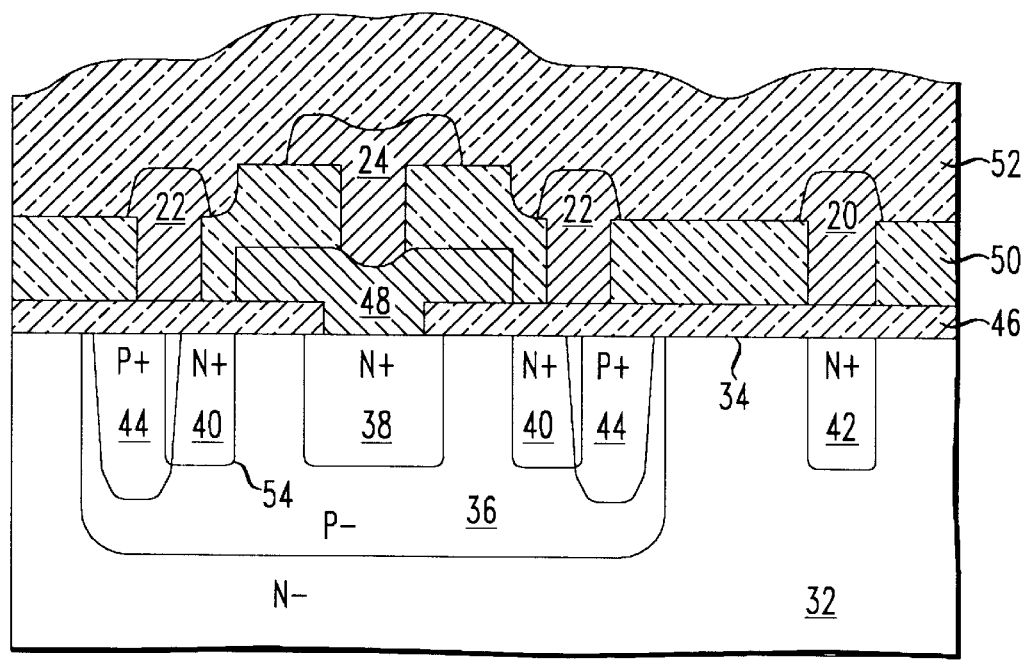

In FIG. 11, a passivation layer is formed over the structure. A layer of silicon nitride 52 is deposited on the exposed upper surfaces of the structure, and then patterned (not shown) using a plasma etch through an eighth photoresist mask (not shown).

Thus, device 10 is fabricated. Advantageously, only eight mask steps are used. It is particularly important that the surface doping of P−type region 36 and the thickness of silicon dioxide 46 be carefully controlled to assure that the threshold voltage is less than the breakdown voltage. Although not essential, it is preferred that device 10 be constructed in a process that includes dielectric isolation as set forth in M. Shibib et al., "A Cost-Effective Smart Power BiCMOS Technology", *Proceedings of The 7th International Symposium on Power Semiconductor Devices & ICs*, Yokohama, Japan, May 23–25, 1995, pages 48–53, which is incorporated herein by reference.

Of course, many variations to the fabrication process of FIGS. 3–11 will be apparent to those skilled in the art. For instance, other gate dielectrics may replace silicon dioxide 46, other protective dielectrics may replace glass 50 and silicon nitride 52, other conductive electrodes may replace polysilicon 48, and other metals may replace aluminum for terminals 20, 22 and 24. The N type and P type materials may be replaced by P type and N type materials, respectively. Furthermore, silicon nitride 52 (and the passivation layer generally) may be omitted thereby reducing the process to seven mask steps. Other deposition and patterning techniques can be used. For instance, polysilicon 48 can be deposited before N+type region 38 is formed, with N+type region 38 doped by N type ions that pass through polysilicon 48 as polysilicon 48 is doped. Likewise, the sequence of steps can be altered. For instance, P+type region 44 can be formed before N+type regions 38, 40 and 42 are formed. Other geometries can be used. In an alternative configuration, it may be desirable for terminal 24 to contact N+type region 38. Likewise, terminal 22 can contact P+type region 44 and be electrically coupled to N+type region 40 by separate metallization. As another alternative, regions 40 and 44 can be spaced from one another. Additional processing steps may also be included, for instance, a thin titanium-tungsten barrier layer may be sputter deposited into the contact windows prior to depositing the aluminum.

Figure 14:
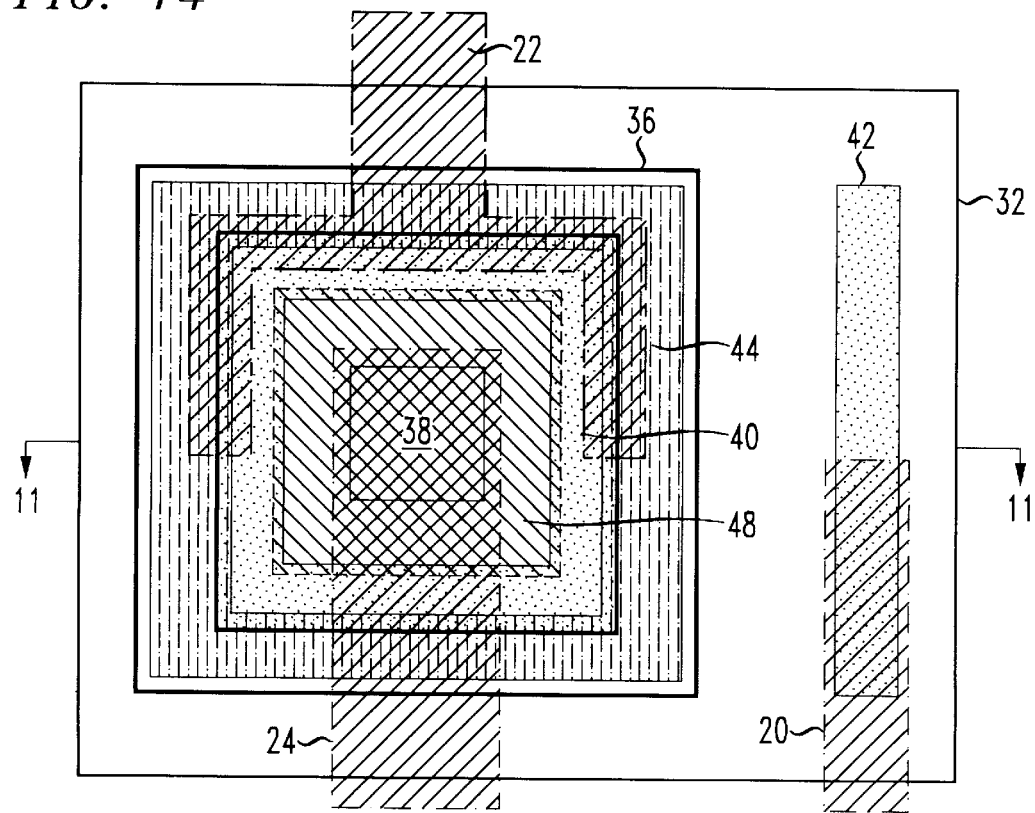

FIG. 14 is a top plan view of FIG. 11. FIG. 14 shows N−type substrate 32, and regions 38, 40, 42 and 44 along surface 34, as well as terminals 20, 22 and 24, and polysilicon 48 above surface 34. Silicon dioxide 46, glass 50, and silicon nitride 52 are omitted for clarity. As is seen, regions 40 and 44 each form a separate well which surrounds region 38, although regions 40 and 44 collectively form a single P+/N+well surrounding region 38. In addition, region 40 forms an inner concentric implant for region 44, and region 38 is centered with respect to regions 40 and 44.

In an alternative embodiment (not shown), substrate 12, regions 38, 40, 42 and 44, and polysilicon 48 can assume a circular or ring-like configuration. In another alternative embodiment (not shown), regions 38 and 40 can each form a single well which surrounds region 44, with region 44 forming an inner concentric implant for region 40, and region 44 centered with respect to regions 38 and 40.

It should be noted that MOS-controlled lateral bipolar transistors are known in the art. MOS-controlled lateral bipolar transistors typically include a gate formed over the base, with the collector providing a drain and the emitter providing a source. MOS-controlled lateral bipolar transistors with the gate electrically coupled to the base may yield very high current gains. If desired, the present invention can be combined with a conventional MOS-controlled lateral bipolar transistor so that the bipolar transistor incorporates two MOS transistors, one for increasing the current gain, and the other for protecting the emitter-base junction against a large reverse-bias.

Referring again to FIG. 11, it is noted that regions 36, 38, and 40 form a parasitic lateral NPN transistor, with N+type region 38 providing the parasitic collector, P−type region 36 providing the parasitic base, and N+type region 40 providing the parasitic emitter. When a forward-bias (i.e., a positive voltage at terminal 22 with respect to terminal 24) is applied at the emitter-base junction of bipolar transistor 12, N+type region 40 is essentially floating and has little or no affect on the operation of bipolar transistor 12. When, however, a reverse-bias of at least the threshold voltage is applied to the emitter-base junction of bipolar transistor 12, then MOS transistor 14 activates and a conductive channel is formed in the channel region between N+type regions 38 and 40. P+type region 44 is at a relatively low potential, and therefore attracts holes from the channel region. The holes are generally blocked by N+type region 40 due to the high potential barrier, and instead travel around N+type region 40 through P−region 36 to P+type region 44. As a result, an IR voltage drop occurs at corner 54 of N+type region 40. When the emitter-base current becomes sufficiently large (for instance, due to electrostatic discharge) and the reverse-bias reaches the forward breakover voltage ($V_{FB}$), the voltage drop at corner 54 reaches approximately 0.6 volts and forward-biases the parasitic emitter-base junction between P−type region 36 and N+type region 40. This causes the parasitic emitter at N+type region 40 to inject additional electrons into the parasitic base at P−type region 36. Many of these injected electrons diffuse across the parasitic base into the parasitic collector at N+type region 38. As a result, the parasitic transistor turns on, and the reverse-bias across the emitter-base junction of transistor 10 is reduced to approximately the collector-emitter voltage of the parasitic bipolar transistor.

If the reverse-bias at the emitter-base junction reaches the punch-through voltage, the drain depletion region in P−type region 36 spreads from N+type region 38 to N+type region 40, which results in space-charge-limited current between N+type regions 38 and 40. Therefore, the punch-through voltage is determined, in part, by the length of the channel region between N+type regions 38 and 40.

It should also be noted that if the punch-through voltage is less than the forward breakover voltage, and the forward breakover voltage is less than the threshold voltage, then the parasitic bipolar transistor can be turned on by a punch-through current in much the same way that it's turned on by a channel current in the conductive channel. That is, during punch-through the holes are attracted to P+type region 44, and a charge that accumulates at corner 54 eventually turns on the parasitic bipolar transistor if the punch-through current is large enough.

Figure 15:
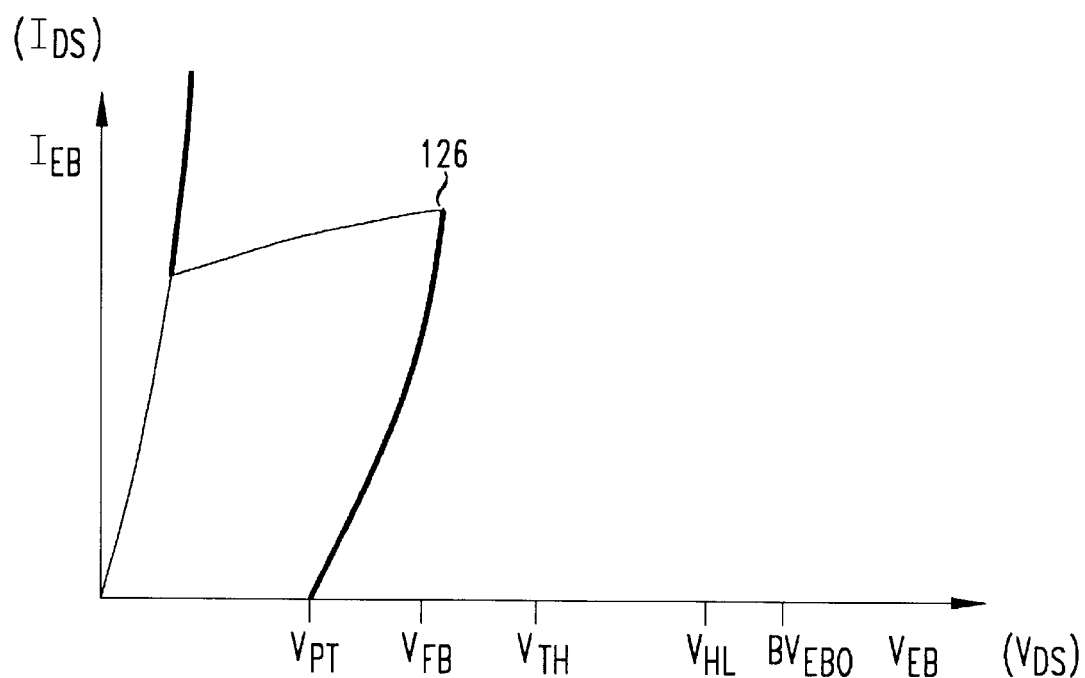
FIGS. 15–16 are current-voltage characteristics of devices in accordance with other embodiments of the invention.

FIG. 15 is current-voltage characteristic of a device in accordance with another embodiment of the invention. The device illustrated in FIG. 15 is similar to device 10, although the punch-through voltage is less than the threshold voltage. The punch-through voltage is also less than the breakdown voltage. Therefore, when the reverse-bias reaches the punch-through voltage, the emitter-base current shown as line 126 rises rapidly, indicating a substantially reduced resistance between the emitter and the base.

Figure 16:
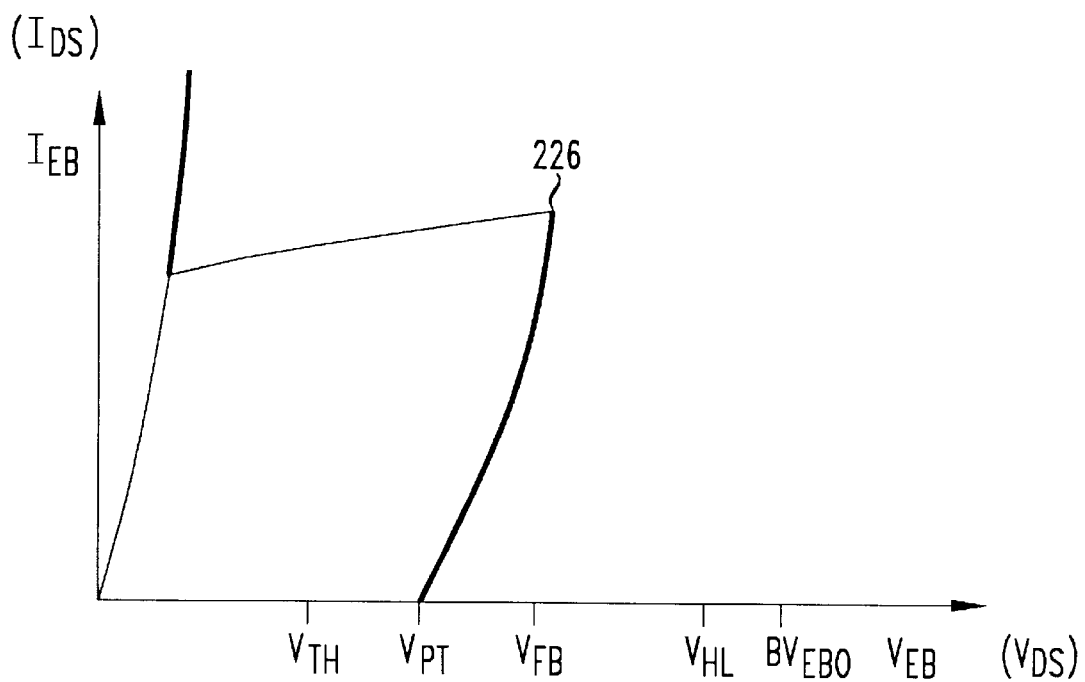

FIG. 16 is a current-voltage characteristic of a device in accordance with yet another embodiment of the invention. The device illustrated in FIG. 16 is similar to device 10, although the gate is electrically coupled to the base instead of to the emitter. Since the source and the body are also electrically coupled to the base, the MOS transistor remains turned off. Although the punch-through voltage is greater than the threshold voltage, the punch-through voltage is less than the breakdown voltage. Therefore, when the reverse-bias reaches the punch-through voltage, the emitter-base current shown as line 226 rises rapidly, indicating a substantially reduced resistance between the emitter and the base.

Although not shown, other devices in accordance with the invention may exhibit a current-voltage characteristic in which one of the threshold voltage and the punch-through voltage is larger than the breakdown voltage, as long as the other of the threshold voltage and the punch-through voltage is less than the breakdown voltage. Still other devices in accordance with the invention may exhibit a current-voltage characteristic in which both the threshold voltage and the punch-through voltage are less than the breakdown voltage, and the MOS transistor both turns on and exhibits punch-through before the reverse-bias reaches the breakdown voltage. Finally, turning on the parasitic bipolar transistor is not essential to the invention.

Of course, the present invention can be implemented with a PNP bipolar transistor and a P-channel MOS transistor in which, for instance, the drain and the gate are electrically coupled to the emitter, and the source and the body are electrically coupled to the base. Furthermore, if desired, bipolar transistor 12 and MOS transistor 14 can be discrete components. Of course, bipolar transistor 12 can be part of a larger device such as a thyristor or a triac. In addition, MOS transistor 14 may be replaced by an equivalent insulated-gate field-effect transistor (IGFET).

A method of protecting an emitter-base junction of a bipolar transistor from a reverse-bias is apparent from the foregoing. The method includes providing a MOS transistor with at least one of a threshold voltage and a punch-through voltage that is less than a breakdown voltage of the emitter-base junction, applying a reverse-bias of at least one of the threshold voltage and punch-through voltage and less than the breakdown voltage to the emitter-base junction, and activating the MOS transistor in response to the reverse-bias so as to substantially reduce a resistance between the emitter and the base. The MOS transistor may be activated, for instance, by applying the reverse-bias of at least the threshold voltage to cause the MOS transistor to turn on and provide a conductive channel between the drain and the source, or by applying the reverse-bias of at least the punch-through voltage to cause the MOS transistor to provide a punch-through current between the drain and the source.

It is understood that while the present invention has been described in terms of several illustrative embodiments, other arrangements and methods of operation will be apparent to those of ordinary skill in the art. For example, the embodiments can be incorporated into general-purpose processors, special-purpose integrated circuits, digital signal processors, or discrete transistor devices. Finally, the present invention can be used in virtually any application where a transistor is desired. Therefore, the invention should be limited only by the spirit and scope of the appended claims.

The invention claimed is:

1. A method of making a bipolar transistor with MOS-controlled protection for a reverse-biased emitter-base junction, comprising the steps of:

providing a first region of a first conductivity type;

introducing a second conductivity type dopant opposite the first conductivity type into the first region to form a second region of a second conductivity type in the first region;

introducing a first conductivity type dopant into the second region to form a third region of the first conductivity type in the second region;

introducing a first conductivity type dopant into the second region to form a fourth region of the first conductivity type in the second region, wherein the fourth region is spaced from the third region;

forming a dielectric layer on the second region; and forming an electrode in electrical contact with the third region and the on the dielectric layer in the spaced area between the third and fourth regions, the electrode over the spaced area forming a gate electrode for a MOS transistor including the fourth region as a source, the third region as a drain and the space therebetween forming the MOS channel, the electrode area contacting the third region forming an electrode for an emitter of a bipolar transistor, the third region defined as the bipolar emitter, the first region as the bipolar collector and the second region as the bipolar base.

2. The method of claim 1 in which the third and fourth regions are formed simultaneously.

3. The method of claim 2 in which the third and fourth regions are formed before the electrode is formed.

4. The method of claim 2 in which the third and fourth regions are formed after the electrode is formed.

5. The method of claim 1 in which the first conductivity type is N, and the second conductivity type is P.

6. The method of claim 1 in which the first conductivity type is P, and the second conductivity type is N.

7. The method of claim 1 in which the dielectric layer includes an oxide, and the electrode includes polysilicon.

8. The method of claim 1 in which the second region provides a parasitic base for a parasitic transistor, the third region provides a parasitic collector for the parasitic transistor, the fourth region provides a parasitic emitter for the parasitic transistor, and a reverse-bias of less than the breakdown voltage across the emitter-base junction turns on the parasitic transistor.

9. The method of claim 1, further including electrically coupling the gate to the second region, wherein the punch-through voltage is less than the breakdown voltage.

10. The method of claim 9, in which the punch-through voltage is less than the threshold voltage.

11. The method of claim 1, further including electrically coupling the gate to the third region, wherein the threshold voltage is less than the breakdown voltage.

12. The method of claim 11, in which the threshold voltage is less than the punch-through voltage.

13. The method of claim 11 in which the electrode is in contact with the third region.

14. The method of claim 11 in which the first, second, third and fourth regions extend to a lateral surface, and the dielectric layer is disposed on the lateral surface.

15. The method of claim 14, in which the second region is a well in the first region, the third and fourth regions are spaced wells in the second region, the channel region is a portion of the second region between the third and fourth regions at the lateral surface, and the dielectric layer and the electrode are above the channel region.

16. The method of claim 15, in which the first region includes a first heavily doped region of the first conductivity type extending to the lateral surface for providing a collector contact, the second region includes a second heavily doped region of the second conductivity type extending to the lateral surface for providing a base contact, the third region is a third heavily doped region of the first conductivity type, and the fourth region is a fourth heavily doped region of the first conductivity type in contact with the second heavily doped region.

17. The method of claim 16 in which applying a reverse-bias to the emitter-base junction which is at least the threshold voltage turns on the MOS transistor such that a conductive channel the channel region substantially reduces a resistance between the emitter and the base.

* * * * *